(12) United States Patent
Weeks et al.

(10) Patent No.: US 7,901,968 B2
(45) Date of Patent: Mar. 8, 2011

(54) HETEROEPITAXIAL DEPOSITION OVER AN OXIDIZED SURFACE

(75) Inventors: Keith Doran Weeks, Gilbert, AZ (US); Paul D. Brabant, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 400 days.

(21) Appl. No.: 11/388,313

(22) Filed: Mar. 23, 2006

(65) Prior Publication Data

US 2007/0224787 A1    Sep. 27, 2007

(51) Int. Cl.
 *H01L 21/20* (2006.01)
(52) U.S. Cl. .......... 438/41; 438/44; 438/413; 438/416; 438/419; 257/E21.09; 257/E21.092; 117/22
(58) Field of Classification Search .............. 438/41, 438/44, 413, 416, 429; 257/E21.09, E21.092; 117/22
See application file for complete search history.

(56) References Cited

U.S. PATENT DOCUMENTS

| | | | |
|---|---|---|---|
| 4,363,828 A | 12/1982 | Brodsky et al. | |
| 5,461,250 A | 10/1995 | Burghartz et al. | |
| 6,346,732 B1 | 2/2002 | Mizushima et al. | |
| 6,395,621 B1 | 5/2002 | Mizushima et al. | |
| 6,411,548 B1 | 6/2002 | Sakui et al. | |
| 6,455,871 B1 | 9/2002 | Shim et al. | |
| 6,461,945 B1 | 10/2002 | Yu | |
| 6,464,780 B1 | 10/2002 | Mantl et al. | |
| 6,482,705 B1 | 11/2002 | Yu | |
| 6,562,703 B1 | 5/2003 | Maa et al. | |
| 6,649,980 B2 | 11/2003 | Noguchi | |
| 6,749,687 B1 | 6/2004 | Ferro et al. | |
| 6,830,964 B1 | 12/2004 | Mears et al. | |
| 6,833,294 B1 | 12/2004 | Mears et al. | |
| 6,875,279 B2 | 4/2005 | Chu et al. | |
| 2003/0036268 A1 | 2/2003 | Brabant et al. | |
| 2003/0057725 A1 | 3/2003 | Hernandez et al. | |
| 2003/0082300 A1 | 5/2003 | Todd et al. | |
| 2003/0124818 A1 | 7/2003 | Luo et al. | |
| 2003/0143783 A1 | 7/2003 | Maa et al. | |
| 2003/0157787 A1 | 8/2003 | Murthy et al. | |
| 2003/0207127 A1 | 11/2003 | Murthy et al. | |
| 2003/0235931 A1 | 12/2003 | Wada et al. | |
| 2004/0097022 A1 | 5/2004 | Werkhoven et al. | |

(Continued)

FOREIGN PATENT DOCUMENTS

EP    0858101    2/1998

(Continued)

OTHER PUBLICATIONS

Wolf, "Silicon Processing for the VLSI Era", vol. 1: Process Technology, pp. 198 & 519-520, 1986.*

(Continued)

*Primary Examiner* — Thanh V Pham
(74) *Attorney, Agent, or Firm* — Knobbe Martens Olson & Bear LLP

(57) ABSTRACT

Some embodiments of the invention are related to manufacturing semiconductors. Methods and apparatuses are disclosed that provide thin and fully relaxed SiGe layers. In some embodiments, the presence of oxygen between a single crystal structure and a SiGe heteroepitaxial layer, and/or within the SiGe heteroepitaxial layer, allow the SiGe layer to be thin and fully relaxed. In some embodiments, a strained layer of Si can be deposited over the fully relaxed SiGe layer.

16 Claims, 4 Drawing Sheets

U.S. PATENT DOCUMENTS

| | | | |
|---|---|---|---|
| 2004/0219735 | A1 | 11/2004 | Brabant et al. |
| 2005/0051795 | A1 | 3/2005 | Arena et al. |
| 2005/0054175 | A1 | 3/2005 | Bauer |
| 2005/0079692 | A1 | 4/2005 | Samoilov et al. |
| 2005/0277260 | A1* | 12/2005 | Cohen et al. .................. 438/387 |
| 2006/0057825 | A1* | 3/2006 | Bude et al. .................... 438/481 |

FOREIGN PATENT DOCUMENTS

| | | |
|---|---|---|
| WO | WO 00/15885 | 3/2000 |

OTHER PUBLICATIONS

Nam et al Appl. Phys. Lett, vol. 71, No. 18, p. 2638 (1997).*
Nakamura et al, Jap. J. Appl. Phys., vol. 36, No. 12A, Part 2, p. L1568 (1997).*
Langdo et al, Appl. Phys. Lett., vol. 76, No. 25, p. 3700 (2000).*
Cannon, D. et al., "Tensile strained epitaxial Ge films on Si(100) substrates with potential application in L-band telecommunications," Applied Physics Letter, vol. 84, No. 6, Feb. 9, 2004, pp. 906-908.
Colace, L. et al., "Efficient high-speed near-infrared Ge photodetectors integrated on Si substrates," Applied Physics Letter, vol. 76, No. 10, Mar. 6, 2000, pp. 1231-1233.
Colace, L. et al., "Ge-on-Si Approaches to the Detection of Near-infrared Light," IEEE Journal of Quantum Electronics, vol. 35, No. 12, Dec. 1999, pp. 1843-1852.
Fama, S. et al., "High performance germanium-on silicon detectors for optical communications," Applied Physics Letters, vol. 81, No. 4, Jul. 22, 2002, pp. 586-588.
Hull, R., "Metastable strained layer configurations in the SiGe/Si System," (1999) *EMIS Datareviews*, Series No. 24 of SiGe and SiGe:C, edited by Erich Kasper et al., INSPEC (2000), London, UK.
Ishikawa, Y. et al., "Strain-induced band gap shrinkage in Ge grown on Si substrate," Applied Physics Letters, vol. 82, No. 12, Mar. 31, 2003, pp. 2044-2046.
Lee et al., "Growth of strained Si and strained Ge heterostructures on relaxed Si1xGax by ultrahigh vacuum chemical vapor deposition," J. Vac. Sci. Technol. B 22(1) (Jan./Feb. 2004).
Li, Q, et al., "Selective growth of Ge on Si(100) through vias of SiO2 nanotemplate using solid source molecular beam epitaxy," Applied Physics Letter, vol. 83, No. 24, Dec. 15, 2003, pp. 5032-5034.
Liu, J. et al., "Silicidation -induced band gap shrinkage in Ge epitaxial films on Si," Applied Physics Letters, vol. 84, No. 5, Feb. 2, 2004, pp. 660-662.
Masini, G. et al., "High-Performance p-i-n. Ge on Si Photodetectors for the Near Infrared: From Model to Demonstration, " IEEE Transactions of Electron Devices, vol. 48, No. 6, Jun. 2001, pp. 1092-1096.
Schollhorn et al., "Coalescence of geranium islands on silicon," Thin Solid Films, vol. 336 (1988), pp. 109-111.
Bauer et al., "High Ge Content Photodetectors on Thin SiGe Buffers", Materials Science and Engineering B89:77-83 (2002).
Bauer et al., "Crystalline to Amorphous Phase Transition in Very Low Temperature Molecular Beam Epitaxy", Materials Science and Engineering B89:263-268 (2002).
Christiansen et al., "Strain Relaxation Mechanisms in He⁻-Implanted and Annealed $Si_{1-x}Ge_x$ Layers on Si(001) Substrates", Material Research Society Symposium Proceedings 686:A1.6.-A1.6.6 (2002).
Haynes et al., "Composition Dependence of Solid-Phase Epitaxy in Silicon-Germanium Alloys: Experiment and Theory", Physical Review B 51:7762-7771 (1995).
Herzog et al., "Si/SiGe n-MODFETs on Thin SiGe Virtual Substrates Prepared by Means of He Implantation", IEEE Electron Device Letters, 23:485-487 (2002).
Huang et al., "SiGe-on-Insulator Prepared by Wafer Bonding and Layer Transfer for High-Performance Field-Effect Transistors", Applied Physics Letters 78:1267-1269 (2001).
Huang et al., "Electron and Hole Mobility Enhancement in Strained SOI by Wafer Bonding", IEEE Transactions on Electron Devices 49:1566-1571 (2002).
Kamins et al., "Deposition of Three-Dimensional Germanium Islands on Si(001) by Chemical Vapor Deposition at Atmospheric and Reduced Pressures", J. Appl. Phys. 81:211-219 (1997).
Kasper et al., "New Virtual Substrate Concept for Vertical MOS Transistors", Thin Solid Films 336:319-322 (1998).
Kutsukake et al., "Fabrication of SiGe-On-Insulator through Thermal Diffusion on Germanium on Si-on-Insulator Substrate", Jpn. J. Appl. Phys. 42:L232-L234 (2003).
Liszkay et al., "Strain Relaxation Induced by He-Implantation at the $Si_{1-x}Ge_x/Si(100)$ Interface Investigated by Positron Annihilation", Applied Surface Science 194:136-139 (2002).
Lyutovich et al., "Interaction Between Point Defects and Dislocations in SiGe", Solid State Phenomena 67-70:179-184 (1999).
Lyutovich et al., "Relaxed SiGe Buffer Layer Growth with Point Defect Injection", Materials Science and Engineering B71:14-19 (2000).
Lyutovich et al., "Thin SiGe Buffers with High Germanium Content for n-MOSFETs", Materials Science and Engineering B89:341-345 (2002).
Luysberg et al., "Effect of Helium Ion Implantation and Annealing on the Relaxation Behavior of Pseudomorphic $Si_{1-x}Ge_x$ Buffer Layers on Si(100) Substrates", Journal of Applied Physics 92:4290-4295 (2002).
Medeiros-Ribeiro et al., "Equilibrium Size Distributions of Clusters During Strained Epitaxial Growth", Materials Science and Engineering B67:31-38 (1999).
Ni et al., "X-ray Reciprocal Space Mapping Studies of Strain Relaxation in Thin SiGe Layers (≦100 nm) Using a Low Temperature Growth Step", Journal of Crystal Growth 227-228:756-760 (2001).
Sugii et al., "SiGe-on-Insulator Substrate Fabricated by Melt Solidification for a Strained-Silicon Complementary Metal-Oxide-Semiconductor", J. Vac. Sci. Technol. B20(5):1891-1896 (2002).
Sugiyama et al., "Formation of Strained-Silicon Layer on Thin Relaxed-SiGe/SiO₂/Si Structure Using SIMOX Technology", Thin Solid Films 369:199-202 (2000).
Teichert et al., "Interplay of Dislocation Network and Island Arrangement in SiGe Films Grown on Si(001)", Thin Solid Films 380:25-28 (2000).
Trinkaus et al., "Strain Relaxation Mechanism for Hydrogen-Implanted $Si_{1-x}Ge_x/Si(100)$ Heterostructures", Applied Physics Letters 76:3552-3554 (2000).

* cited by examiner

HETEROEPITAXIAL DEPOSITION OVER AN OXIDIZED SURFACE

BACKGROUND OF THE INVENTION

1. Field of the Invention

This invention relates to methods for depositing heteroepitaxial films in semiconductor manufacturing. More particularly, this invention relates to methods for depositing relaxed heteroepitaxial films.

2. Description of the Related Art $Si_xGe_{1-x}$ films are used in a wide variety of semiconductor applications. An issue that often arises during the production of these materials is the lattice strain that may result from heteroepitaxial deposition. A "heteroepitaxial" deposited layer is an epitaxial or single crystal film that has a different composition from the single crystal substrate onto which it is deposited. A deposited epitaxial layer is said to be "strained" when it is constrained to have a lattice structure in at least two dimensions that is the same as that of the underlying single crystal substrate, but different from its inherent lattice constant. Lattice strain occurs because the atoms in the deposited film depart from the positions that they would normally occupy in the lattice structure of the free-standing, bulk material when the film deposits in such a way that its lattice structure matches that of the underlying single crystal substrate. For example, heteroepitaxial deposition of a Ge-containing material such a SiGe or Ge itself onto a single crystal Si substrate generally produces compressive lattice strain because the lattice constant of the deposited Ge-containing material is larger than that of the Si substrate. The degree of strain is related to the thickness of the deposited layer and the degree of lattice mismatch between the deposited material and the underlying substrate.

Strain is in general a desirable attribute for active device layers, since it tends to increase the mobility of electrical carriers and thus increase device speed. In order to produce strained layers on conventional silicon structures, however, it is often helpful to create a strain relaxed, intermediate heteroepitaxial layer to serve as a template for a further strained layer that is to remain strained and serve as an active layer with increased carrier mobility. These intermediate films are often provided by a relaxed $Si_xGe_{1-x}$ "buffer" layer over single crystal unstrained silicon (e.g., wafer surface), which can be engineered to provide the desired strain of an overlying layer (e.g., strained silicon layer).

Many microelectronic devices incorporate Ge-containing layers such as SiGe. To provide increased device performance, it is usually advantageous to have a relatively high germanium content in the SiGe layer. When deposited onto a single crystal Si substrate or layer, greater amounts of germanium generally increase the amount of compressive strain. The higher the Ge content, the greater the lattice mismatch with underlying Si, up to pure Ge, which has a 4% greater lattice constant compared to silicon. As the thickness of the SiGe layer increases above a certain thickness, called the critical thickness, the SiGe layer begins to relax to its inherent lattice constant, which requires the formation of misfit dislocations at the film/substrate interface. The critical thickness depends upon temperature (the higher the temperature, the lower the critical thickness) and mismatch due to germanium content (the higher [Ge], the lower the critical thickness). For example, SiGe containing about 10% germanium has a critical thickness of about 300 Å at about 700° C. for an equilibrium (stable) strained film and about 2,000 Å for a metastable, strained film on Si.

Although sometimes the relaxation is desired, when forming a buffer for subsequent strained deposition, the relaxation should be controlled to minimize some types of dislocations, such as vertically propagating or threading dislocations. Such dislocations lead to reduced carrier mobility, current leakage, reduced device performance and even device failure. Furthermore, buffer films should be fully relaxed. After reaching the critical thickness, heteroepitaxial films often only partially relax, in which case the overlying strained layers will not attain their maximum potential strain. Furthermore, partial relaxation may lead to undesired and uncontrolled relaxation during future thermal cycles.

SUMMARY OF THE INVENTION

In some embodiments, the invention provides a method of fabricating an integrated circuit that comprises: conducting a native oxide clean of a Si substrate; oxidizing a top surface of the Si substrate to form an oxidized surface; and depositing onto the oxidized surface of the Si substrate a heteroepitaxial layer of SiGe. In some embodiments, the thickness of the SiGe layer is less than 1000 Å. The SiGe layer may also be fully relaxed and/or free of cross hatches as deposited. One aspect of the invention may include an oxidized top surface of a Si substrate in which the oxygen concentration is less than about $7 \times 10^{14}$ atoms/cm$^2$. Preferably, the top surface is oxidized such that the concentration of oxygen on the top surface of the Si substrate is in the range of $10^{13}$ to $10^{14}$ atoms/cm$^2$.

In other embodiments, a method of forming an integrated circuit is provided that comprises: oxidizing a top surface of a first single crystal semiconductor structure; and heteroepitaxially depositing a second single crystal structure directly over the oxidized surface, where the second single crystal structure has a different material composition from the first single crystal structure. In some embodiments, the single crystal semiconductor structure is the top surface of a wafer. Preferably, the second single crystal structure is heteroepitaxial. In some embodiments, oxygen is present within the SiGe layer. In some embodiments, the second single crystal structure is fully relaxed and free of cross hatches as deposited. Preferably, the thickness of the second single crystal structure is less than 2000 Å. In some embodiments, first single crystal structure is oxidized such that the concentration of oxygen is less than about $7 \times 10^{14}$ atoms/cm$^2$. The first single crystal structure may be oxidized such that a concentration of oxygen on the top surface is in the range of $10^{13}$ to $10^{14}$ atoms/cm$^2$.

One embodiment of the invention provides an integrated circuit that comprises: a single crystal silicon structure; a layer of fully relaxed heteroepitaxial SiGe directly overlying the silicon structure. Preferably, the SiGe layer has a thickness less than 1000 Å. Preferably, the SiGe layer is fully relaxed and/or free of cross hatches as deposited. The SiGe layer in the integrated circuit has a Ge concentration between 1 atomic % and 100 atomic %. In a preferred embodiment, oxygen is present at an interface between the silicon structure and the SiGe layer. In some embodiments, oxygen is only present within the SiGe layer and is not present at the interface. It is also contemplated that oxygen may be present both at an interface between the silicon structure and the SiGe layer as well as within the SiGe layer. In some embodiments, the concentration of oxygen at the interface is less than about $5 \times 10^{14}$ atoms/cm$^2$. Preferably, the concentration of oxygen at the interface is in the range of $10^{13}$ to $10^{14}$ atoms/cm$^2$. In some embodiments, the surface roughness of the SiGe layer as deposited is between 5 Å rms and 50 Å rms. In alternative embodiments, the integrated circuit may further comprise a semiconductor layer over the SiGe layer wherein the semiconductor layer is strained.

In another embodiment, the invention provides a system that comprises: a single crystal silicon structure; and a layer of as-deposited single crystal SiGe formed on the silicon structure, the SiGe being fully relaxed and free of cross-hatches. Preferably, the layer of SiGe is fully relaxed and free of cross-hatches as deposited. The thickness of the layer of SiGe may be less than 1000 Å.

In another embodiment, the invention provides a method of forming an integrated circuit that comprises: providing a top surface of a single crystal semiconductor structure with a non-zero concentration of oxygen of less than about $5\times10^{14}$ atoms/cm$^2$; and epitaxially depositing a second single crystal structure onto the top surface that has the concentration of oxygen. In some aspects of the invention, the top surface of the single crystal semiconductor structure is cleaned prior to providing oxygen to the top surface. In some embodiments, the concentration of oxygen at the top surface is in the range of $10^{13}$ to $10^{14}$ atoms/cm$^2$.

In an alternative embodiment, a method of fabricating an integrated circuit is provided that comprises: cleaning a Si substrate; forming at least a partial layer of oxidation on a cleaned surface of the Si substrate; and depositing onto the oxidized surface of the Si substrate a heteroepitaxial layer of a different material composition from the Si substrate.

In another embodiment, a method of fabricating an integrated circuit is provided that comprises: cleaning a Si substrate; depositing onto the Si substrate a heteroepitaxial layer having a different lattice constant from the Si substrate; and introducing oxygen during the deposition of the heteroepitaxial layer. In some embodiments, oxygen is present within the heteroepitaxial layer.

In some embodiments, an integrated circuit is provided that comprises: a single crystal silicon structure; oxygen on a surface of the single crystal silicon structure at a concentration less than about $5\times10^{14}$ atoms/cm$^2$; and a layer of fully relaxed heteroepitaxial SiGe directly overlying the silicon structure. Preferably, the concentration of oxygen on the single crystal silicon structure is in the range of $10^{13}$ to $10^{14}$ atoms/cm$^2$. In some embodiments, the oxygen on the surface of the crystal silicon structure is provided by a pure pure or dilute stored oxygen source.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF THE PREFERRED EMBODIMENTS

Figure 1:
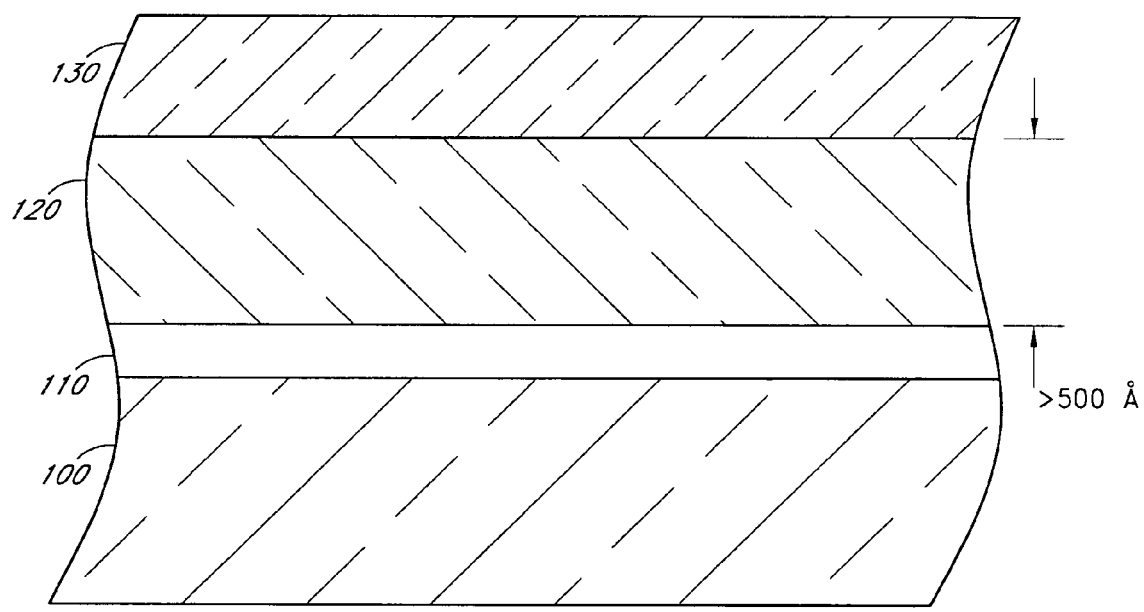
FIG. 1 shows a cross sectional view of a multilayer semiconductor structure according to one embodiment of the invention.

As used herein, "single-crystal" or "epitaxial" is used to describe a predominantly large crystal structure that may have a tolerable number of faults therein. The skilled artisan will appreciate that crystallinity of a layer generally falls along a continuum from amorphous to polycrystalline to single-crystal; the skilled artisan can readily determine when a crystal structure can be considered single-crystal or epitaxial, despite a low density of faults.

Epitaxy refers to deposition where the deposited layer serves as an extension of the crystal structure of an underlying layer. Heteroepitaxy is a species of epitaxy in which the underlying layer and the overlying deposited layer are of different materials. Heteroepitaxy deposition techniques are well known in the art and, in fact, are considered advantageous in creating crystal strain by the lattice mismatch between the underlying layer and the overlying layer. Such heteroepitaxial layers are commonly formed by epitaxially depositing silicon germanium over a single-crystal silicon structure, such that the lattice constants of the two layers are not exactly matched. This strain is considered advantageous because it increases electrical carrier mobility within the semiconductor structure, thus boosting transistor performance. For complementary metal oxide semiconductor field effect transistors (CMOS) based on SiGe barriers, a band discontinuity of the valence band and the conduction band is needed. Whereas tensile strained Si and compressively strained SiGe deliver a staggered band offset (type II heterointerface), the conduction band offset for strained SiGe on Si is negligible. One of the main challenges is the difficulty of obtaining a relaxed SiGe structure with smooth surface morphology and less defects.

A preferred embodiment provides methods for depositing $Si_{1-x}Ge_x$ films and the $Si_{1-x}Ge_x$ films deposited thereby, in which x is in the range from zero to one. For example, various semiconductor fabrication processes involve the deposition of a Ge-containing material onto a Si-containing substrate. "Substrate," as used herein, can refer to a bare wafer or to such a workpiece with layers already formed on it. A preferred application for the $Si_{1-x}Ge_x$ layer is as a relaxed buffer layer between an underlying unstrained single crystal Si structure and an overlying strained Si epitaxial layer.

The natural lattice constant of SiGe is higher than the natural lattice constant of single crystal silicon. Typically, SiGe that is deposited below a critical thickness will adopt the lattice size of Si, causing compressive strain in the SiGe. If the SiGe exceeds the critical thickness, the SiGe will begin to relax and migrate toward its own lattice size. For purposes of this disclosure, critical thickness is defined as the point at which a SiGe layer begins to relax toward its own lattice size. As the thickness of an SiGe layer increases, the layer continues to experience relaxation until it reaches its own natural lattice constant. For purposes of this disclosure, a SiGe layer that has adopted its own natural lattice constant on a nanometer scale throughout the film is considered "fully relaxed." The overlying strained epitaxial layer that is deposited on the relaxed SiGe layer is strained because it is forced to align with the larger lattice constant of the relaxed SiGe buffer layer. Thus, use of the relaxed SiGe buffer layer provides a way to produce an overlying strained epitaxial Si layer. This is desired because an overlying strained Si layer contributes to increased carrier mobility. While the examples described herein involve Si and SiGe, the skilled artisan will appreciate that the principles and advantages taught herein are applied to heteroepitaxy of other materials.

Referring to FIG. 1, one embodiment of the invention provides: a single crystal Si substrate 100; oxygen 110 provided on the top surface of the Si substrate 100; a thin and fully relaxed SiGe layer 120 formed over the Si substrate 100; and a strained silicon layer 130 formed over the SiGe layer

120. In alternative embodiments, any single crystal semiconductor structure can be used in place of the Si substrate 100. Despite the representation of a layer 110 in FIG. 1, the skilled artisan will appreciate from the description below that 110 in reality represents a surface modification, and that a continuous layer is unlikely to form.

Some embodiments of the invention provide techniques for creating a SiGe layer that fully relaxes at a relatively low thickness relative to conventional processes currently known in the art. Fully relaxed SiGe layers of reduced thickness offer many advantages. Less deposition material is required, which reduces the cost of depositing the SiGe layer. Furthermore, thinner SiGe layers result in reduced deposition time which correlates to increased efficiency for processes that require fully relaxed SiGe layers.

Figure 2:
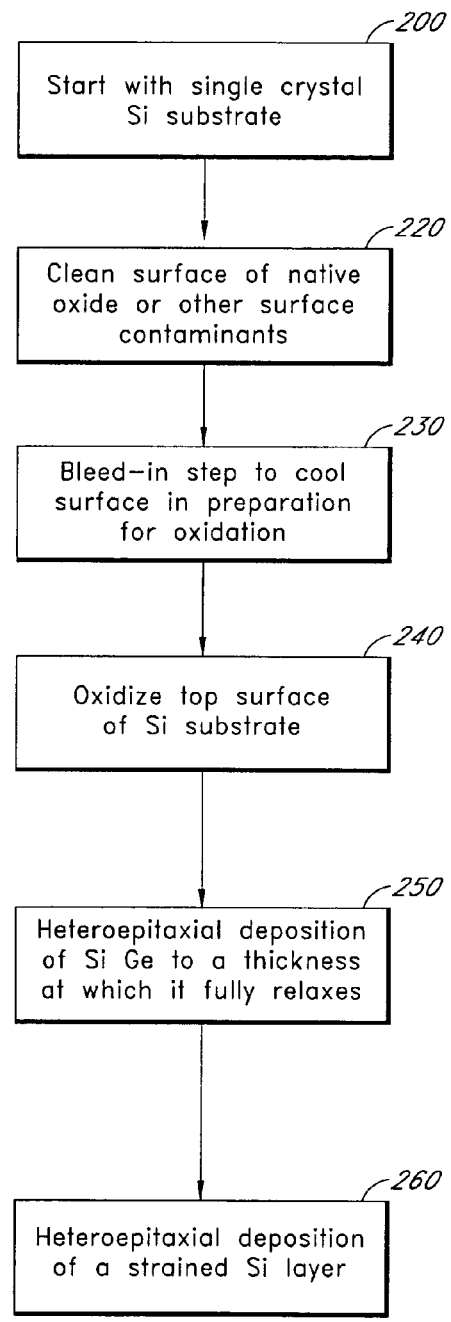
FIG. 2 shows a flowchart of a deposition process according to another embodiment of the invention.

Referring to FIG. 2, a method for achieving a thin and relaxed SiGe layer in accordance with a preferred embodiment is illustrated. As indicated in operational block 200, the substrate includes a single crystal structure at an upper surface. For example, the substrate may be a Si wafer or a substrate with an eptiaxial Si layer at the upper surface. The surface of the Si substrate is preferably cleaned to remove contaminants and any naturally occurring or native oxide, as represented by operational block 220. Operational block 230 represents a step in which the wafer is cooled down to a temperature suitable for oxidation. As shown in operational block 240, the top surface of the single crystal Si surface may be oxidized. In some embodiments, a partial layer of oxygen is formed on the Si substrate, preferably a controlled oxidation. Thereafter, as indicated by operational block 250, a SiGe layer may be heteroepitaxially deposited onto the oxidized surface through chemical vapor deposition ("CVD") to a thickness at which the SiGe layer is fully relaxed. Advantageously, this method allows deposition of a fully relaxed layer of SiGe that would be at least partially strained if deposited by processes known in the art. In some embodiments, an overlying strained Si layer is heteroepitaxially deposited over the fully relaxed SiGe layer, as shown in operational block 260.

Figure 3:
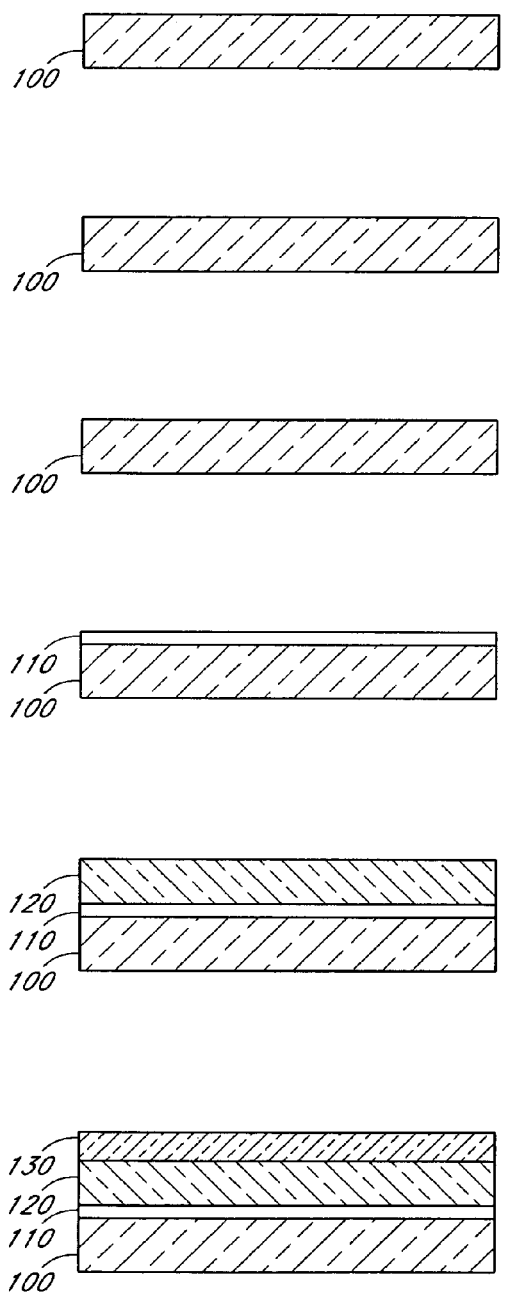
FIG. 3 shows the cross sections of the in-process semiconductor structure of FIG. 1 after each step in the process of FIG. 2.

Cross-sectional views of the sequentially deposited layers are illustrated in FIG. 3. The cross sections in FIG. 3 are schematic physical representations of the corresponding process step indicated in FIG. 2. Operational block 200 in the flow chart of FIG. 2 correlates to the cross-section 300 in FIG. 3 of a Si substrate 100 with a single crystal structure on the top surface. Operational block 220 in the flow chart of FIG. 2 correlates to the cross-section 320 in FIG. 3 of a Si substrate 100 that has undergone a cleaning process to remove oxide or other surface contaminants. Operational block 230 in the flow chart of FIG. 2 correlates to the cross-section 330 in FIG. 3 of a clean Si substrate 100 that has been cooled to a temperature suitable for oxidation. As will be better understood from the preferred cool-down process described below, a thin epitaxial layer (not shown) may or may not form during the cool-down process, depending upon the selected conditions. Operational block 240 in the flow chart of FIG. 2 correlates to the cross-section 340 in FIG. 3 of a Si substrate 100 with a partial layer of oxide 110 on its top surface. Despite the schematic representation of a layer 110 in FIG. 3, the skilled artisan will appreciate from the description below that 110 in reality represents a surface modification, and that a continuous layer is unlikely to form. Operational block 250 in the flow chart of FIG. 2 correlates to the cross-section 350 in FIG. 3 in which a fully relaxed layer of SiGe overlies the oxidized Si substrate 100. Operational block 260 in the flow chart of FIG. 2 correlates to the cross-section 360 in FIG. 3 that shows a strained Si layer 130 overlying the fully relaxed SiGe layer 120.

In one embodiment, a silicon wafer is the underlying single crystal substrate on which the SiGe layer 120 is deposited. In other embodiments, the single crystal surface is provided by epitaxially depositing a single crystal layer onto a wafer surface using conventional CVD equipment. In one embodiment, the point defect density at the surface of the Si substrate 100 is high enough to reduce threading dislocations in the overlying SiGe layer 120 and enable a thin, fully relaxed SiGe layer. Preferably, the point defect density at the surface of the Si substrate 100 is not so high that polycrystalline or amorphous SiGe forms over the Si substrate 100.

Cleaning Step

In a preferred embodiment of the invention, the Si substrate 100 is first cleaned to remove contaminants and naturally occurring or native oxide at the upper surface, as indicated in operation block 220. Conventionally, wafer cleaning is conducted ex situ prior to loading the wafer into the process chamber. For example, wafers may be cleaned in a SC1/HF wet etch bath. Alternatively, an integrated HF and acetic acid vapor clean can be conducted in a neighboring module within a cluster tool, reducing transport time and opportunity for recontamination or reoxidation. In a preferred embodiment, a hydrogen bake step is alternatively or additionally conducted within the deposition chamber to sublimate native oxide. To prepare for heteroepitaxial SiGe deposition onto a single crystal Si substrate, the Si substrate 100 is preferably baked at about 800° C. to 1190° C. or higher for between about 30 seconds and 120 seconds. In an alternative embodiment, a quick "spike" bake is conducted, such as that disclosed by U.S. Patent Application Publication 2003/0036268 the disclosure of which is hereby incorporated herein in its entirety. In some embodiments, top lamps are provided as a heat source and are heated at full power during the "spike" bake. Preferably, this takes place in the deposition chamber, and the Si substrate is placed on a susceptor housed within the deposition chamber. Preferably, the susceptor never reaches a temperature higher than 750° C. Preferably, the "spike" bake process is relatively short. For example, the "spike" bake process may be shorter than 45 seconds. Small amounts of HCl vapor can be added to this step to aid in cleaning metal contaminants and the like during the hydrogen bake. In another arrangement, plasma products can assist or conduct in situ cleaning, such as by substituting H radicals for hydrogen gas. In still further embodiments, the wafer is cleaned using a bake step without the SC1 wet etch bath.

Cool Down Step

In some embodiments of the invention, the Si substrate is cooled from the high-temperature hydrogen bake to a lower temperature suitable for the intentional oxidation step 230 (FIG. 2). Desirably, the Si substrate 100 is cooled to a temperature between 350° C. and 550° C., more preferably to between about 450° C. and 500° C., and most preferably to about 450° C. To minimize surface contamination, the cleaned Si substrate 100 is preferably maintained under vacuum during cooling. It will also be understood that some embodiments of the invention may not include a cool down step.

During this cooling period, it is highly desirable for the surface of the Si substrate 100 to be kept free of contamination by e.g., oxygen or carbon. In one embodiment of the instant invention, the high temperature Si substrate 100 surface is protected from contamination during cooling by contacting the Si substrate 100 surface with a surface active compound, preferably a semiconductor precursor such as a Si or Ge source chemical, during at least part of the time that the surface is cooling. The term "surface active compound" refers to a chemical compound that protects a single crystal Si-containing surface from contamination without interfering with the oxidation of the substrate surface or the heteroepitaxial deposition of the subsequent layer.

Depending on the cooling conditions, preferred surface active compounds for this purpose include silanes (e.g., silane, disilane, and trisilane), halosilanes (e.g., chlorosilane, dichlorosilane, trichlorosilane, and tetrachlorosilane), alkylsilanes (e.g., methylsilane, dimethylsilane, trimethylsilane and tetramethylsilane), germanes (e.g., germane, digermane) and halogermanes (e.g., dichlorogermane, trichlorogermane, tetrachlorogermane). During cooling, the Si substrate 100 surface is preferably contacted with a surface active compound that undergoes little or no thermal decomposition under the cooling conditions (e.g., temperature, pressure, cooling rate). Dichlorosilane and trichlorosilane are examples of particularly preferred surface active compounds suitable for use in this embodiment. The contacting of the Si substrate 100 with the surface active compound during the cooling period is preferably carried out by flowing or diffusing the surface active compound across the Si substrate 100 surface. Routine experimentation may be used to select a flow rate that supplies an amount of surface active compound to the surface that is effective to reduce or avoid contamination during cooling. Alternatively, the surface active compound can be a source of adsorbed species (e.g., halides) such as HCl, rather than a source of silicon or germanium. Without wishing to be bound by theory, HCl may adsorb Cl atoms on the surface and/or may etch undesirable contamination that may form during cooling, but can also serve to exclude contaminants if a high flow rater is employed. Silicon or germanium sources, as listed above, however, are preferred.

In experiments, a substrate was cooled from a bake temperature between about 800° C. to 1190° C. at a cooling rate of about 3° C. per second, while maintaining the reactor pressure at about 10 Torr. Those skilled in the art will understand from the disclosure herein that the pressure within the reactor during the cooling time period can generally be in the range of about 10 Torr to about 100 Torr, but is more preferably about 10 Torr to about 80 Torr, and that the cooling rate is preferably in the range of about 1° C. per second to about 5° C. per second. Additional information regarding the use of a protective cool down with semiconductor precursors bleed in process can be found in U.S. Patent Application Publication 2004/0219735 the disclosure of which is hereby incorporated herein in its entirety. In some embodiments, the cool down step may produce a thin epitaxial layer (not shown), depending on the selected conditions. For example, deposition of a thin epitaxial layer of Si may result from using a surface active compound that contains Si during the cooling process (e.g., dichlorosilane), to exclude oxygen and other contaminants during cooling.

Oxidation Step

In a preferred embodiment of the invention, a clean substrate is provided with an oxidized interface 110 prior to depositing the SiGe layer 120. The oxidation step is depicted in operational block 240 of FIG. 2. Preferably, the oxidized interface 110 between the Si substrate 100 and the SiGe layer 120 contributes to a fully relaxed layer of SiGe 120 that is of less thickness than a SiGe layer deposited onto a non-oxidized Si surface under substantially identical conditions. In some embodiments, there is an oxygen layer 110 at the interface between the Si substrate 100 and the SiGe layer 120. However, the skilled artisan will appreciate from the description below that 110 in reality represents a surface modification, and that a continuous layer is unlikely to form.

In some embodiments, the SiGe layer relaxes earlier than a SiGe layer deposited onto a non-oxidized Si surface under substantially identical conditions. However, it is contemplated that deposition of SiGe may continue beyond the thickness at which the SiGe layer fully relaxes. The skilled artisan will recognize that the early relaxation of the SiGe layer may provide benefits regardless of whether deposition is continued after reaching the thickness at which full relaxation occurs. For example, SiGe layers deposited according to the invention at a thickness greater than the full relaxation thickness may produce superior results with respect to threading dislocations and pile ups. Particular benefits, however, are derived from reduced thickness of a relaxed buffer layer.

Preferably, the oxidized interface 110 is accomplished by exposing the surface of the Si substrate 100 to an oxidizing environment. Many oxidants known in the art may be used. Preferably, $O_2$ at concentration in the range of 100 ppm to 1% is delivered in He. In other embodiments, $NO_2$ or $O_3$ can be used as sources of oxygen. Remote plasma activated oxygen is used in alternative embodiments, which may allow for lower temperatures during oxidation. In a further embodiment a SiGe layer 120 may be grown on a Si substrate 100 that is oxidized by means other than a purified source of oxidant.

In one preferred embodiment, the Si substrate 100 is oxidized in an Epsilon™ reactor using 1% $O_2$ in He for a duration in the range of about 0.5 to 60 seconds, more preferably 1-10 seconds and most preferably about 2 seconds. Preferably, the flow rate is about 1000 sccm, but it is contemplated that the flow rate could be increased to decrease the time required for oxidation duration and decreased to increase the time required for oxidation. The oxidation temperature is preferably between 350° C. and 550° C., more preferably to between about 450° C. and 500° C., and most preferably to about 450° C. The pressure during oxidation may be between 10 Torr and 100 Torr, and is preferably about 80 torr. In some embodiments, $H_2$ is introduced during oxidation to preserve the hydrogen termination from the HF bath and to slow the oxidation process. Advantageously, slowing the oxidation process provides more control over the oxidation. The flow of $H_2$ may be between 5-100 slm, more preferably between 10-30 slm, and most preferably about 20 slm. The skilled artisan would appreciate that the process ranges provided here are appropriate for the equipment described in this embodiment. It is contemplated that different equipment may be used in alternative embodiments, and the process ranges may change to better suit the equipment used. In particular, the skilled artisan will appreciate that larger systems than the preferred single wafer Epsilon® systems will employ different parameters.

Preferably, less than a full monolayer of oxide is formed on the silicon surface, leaving some single-crystal Si exposed. Preferably, the oxygen concentration on the Si substrate 100 is not more than $7 \times 10^{14}$ atoms/cm$^2$. More preferably, the oxygen concentration is in the range $10^{13}$ atoms/cm$^2$ to $10^{14}$ atoms/cm$^2$.

In one embodiment, oxygen (or other impurity to cause point defects) is introduced during SiGe deposition rather than before. Generally, oxygen may be present within the SiGe layer 120, which may also contribute to the reduction of the critical thickness of the SiGe layer 120 that is described above. In some embodiments, there is oxygen present within the SiGe layer 120 as well as at the interface between the SiGe 120 layer and the Si substrate 100.

Deposition of the SiGe

Prior to depositing the SiGe layer 120, the deposition chamber is preferably purged of all oxygen and ramped up to a temperature that is appropriate for SiGe deposition. Preferably, $H_2$ continues to flow through the chamber at a flow rate of about 20 slm. In one embodiment, it takes about 85 seconds to ramp up to the SiGe deposition temperature, which is also sufficient time to purge the deposition chamber of oxygen.

In a preferred embodiment, a SiGe layer 120 is heteroepitaxially deposited onto the oxidized Si substrate 100, as depicted in operational block 250 in the flow chart of FIG. 2. Preferably, when the SiGe layer 120 reaches a certain thickness, it fully relaxes. In the preferred embodiment, the SiGe layer 120 fully relaxes at a thickness less than that of a SiGe layer deposited onto a non-oxidized Si substrate under substantially identical conditions. Preferably, the SiGe layer fully relaxes at a thickness less than 3000 Å, more preferably less than 2000 Å, and most preferably less than 1000 Å.

In a preferred embodiment, deposition of the SiGe layer 120 is carried out by chemical vapor deposition (CVD). The CVD may take place in a reactor such as the Epsilon™ CVD reactor available from ASM America. Routine experimentation can be used to determine the deposition conditions (e.g., deposition temperature and deposition pressure) for any particular $Si_{1-x}Ge_x$ layer. Preferably, deposition is from trisilane ($Si_3H_8$) and $GeH_4$ (or other germanium precursor(s)) at a temperature of about 450° C. to 900° C., more preferably from about 600° C. to 800° C., and most preferably about 700° C. In the case of a single wafer chamber the pressure is preferably in the range of about 1 Torr to atmospheric pressure, more preferably about 10 Torr to 100 Torr. In some embodiments of the invention, the pressure in the deposition chamber remains constant for the oxidation step and the SiGe deposition. It is contemplated that in other embodiments the epitaxial nature of the deposited SiGe layer 120 can be realized by a number of different methods.

In one preferred embodiment the concentration of $GeH_4$ is about 1.5% Preferably, the main carrier gas is $H_2$ and has a flow rate of about 10 sccm to about 100 slm, more preferably at about 20 slm. In one illustrative example, a SiGe layer that is 21% Ge is deposited that is fully relaxed at 700 Å thick. The duration for SiGe deposition in this example is about 15 minutes. In contrast, a SiGe layer deposited under similar conditions without an oxidation step may require deposition to a thickness of thousands of Angstroms before it fully relaxes. Furthermore, the deposition of SiGe layers without an oxidation step may not allow as high a point defect density, which may lead to undesired threading dislocations. In some embodiments, the invention allows the heteroepitaxial deposition of fully relaxed SiGe layers without dislocation pile-ups.

The thickness of the SiGe layer 120 that is deposited over the Si substrate 100 will be partly based on the desired concentration of germanium in the strain-relaxed SiGe layer 120. The range of Ge concentration for the deposited Ge layer may be anywhere from 1% to 100%. Preferably, the Ge concentration is less than 80% and is more preferably within the range of 20% to 40%. Surprisingly, even with less than 40% Ge, 1000 Å SiGe layer can fully relax. Higher concentrations of Ge correlate to SiGe layers that fully relax at lower thicknesses and at lower temperatures. Reduced thickness of the SiGe layer provides a more efficient process. Furthermore, lower deposition temperatures tend to be more appropriate for precursors with lower thermal stability. As one example in which good results were obtained, an SiGe layer 120 with 20% Ge that was deposited at 700° C. onto an oxidized surface fully relaxed at 700 Å. In comparison, SiGe layers with 20% Ge that are deposited under substantially similar conditions do not typically achieve full relaxation until their thickness exceeds approximately 10,000 Å.

In this embodiment, the oxidation at the SiGe/Si interface allows a SiGe layer, which is deposited heteroepitaxially, to relax or adopt its natural lattice constant after it reaches a certain thickness. This allows strain between the Si substrate 100 and the heteroepitaxial SiGe layer 120 to be released. Accordingly, undesired types of defect formation are minimized as the fully relaxed SiGe layer 120 develops. Furthermore, the presence of an oxidized interface 110 results in a fully relaxed SiGe layer 120 that is thinner and therefore more quickly formed than a fully relaxed SiGe layer that results from a substantially identical process without the oxidized interface 110. The thickness at which the SiGe layer 120 fully relaxes will depend on the concentration of Ge in the SiGe layer 120. Preferably, a fully relaxed layer of SiGe 120 of 5% Ge to 50% Ge is achieved that is between about 500 Å and 10,000 Å in thickness, more preferably between 500 Å and 3,000 Å. For deposition of 100% Ge, the layer 120 could fully relax at a thickness of a few monolayers. Advantageously, this thickness is less than SiGe layers deposited without an oxidation step.

Fully relaxed SiGe layers are desirable because they provide better carrier mobility in the overlying strained layer 130. Additionally, complications resulting from partially relaxed layers that further relax during subsequent process steps can be avoided. Thinner SiGe layers result in reduced deposition time which correlates to increased efficiency for processes requiring fully relaxed SiGe deposition. Furthermore, less deposition material is required for thinner layers, which reduces the cost of depositing the SiGe layer.

Typically, relaxed silicon germanium layers have a slight surface roughness that can be detected using a particle detection tool. In one embodiment of the invention, the SiGe layer 110 is free of detectable cross-hatches as deposited. Preferably, the surface of the SiGe layer 110 is sufficiently flat such that no planarization is required prior to deposition of the overlying Si layer 130. The surface roughness of the SiGe layer 110 is preferably 1 Å rms to 150 Å rms, more preferably from 1 Å rms to 5 Å rms.

Deposition of the Overlying Si Layer

In one embodiment of the invention, an overlying Si layer is formed directly over the SiGe layer 120, as illustrated in operation block 260 in FIG. 2. Preferably a single crystal silicon layer 130 (FIG. 3) is heteroepitaxially deposited over the SiGe layer 120 such that the Si layer 130 is strained to match the lattice structure of the fully relaxed SiGe layer 120. The Si layer 130 is typically deposited by CVD, preferably in the same reaction space as the deposition of the SiGe layer 120. For example, after deposition of the SiGe layer 120, the flow of $GeH_4$ can be shut off, and a layer of single crystal silicon can be grown from trisilane at the same deposition temperature. In alternative embodiments, the deposition of the Si layer 130 can occur at a temperature different than that of the SiGe layer 120 deposition.

The tensile strained Si layer 130 provides improved electrical carrier mobility in devices fabricated from the structures described herein. For example, in transistor fabrication, the tensile strained Si layer 130 allows transistors having faster response times to be fabricated. Advantageously, tensile strained Si or SiGe provides for good electron mobility (NMOS). In other embodiments, the relaxed SiGe layer 120 is covered by a heteroepitaxially-grown compressive strained Ge layer. Likewise, the relaxed SiGe layer 120 can be covered by a heteroepitaxially-grown compressive strained SiGe layer with high Ge content. Advantageously, compressive strained Ge or SiGe provides for good hole mobility (PMOS).

Figure 4:
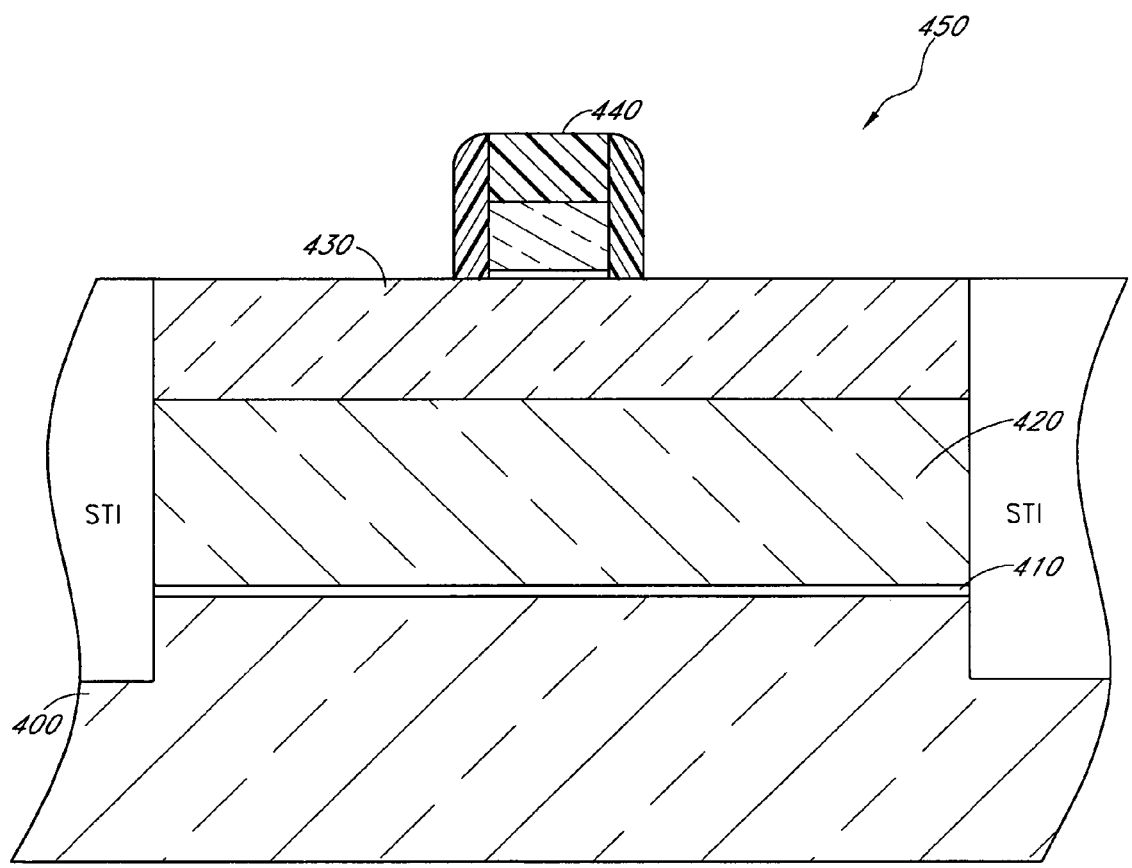
FIG. 4 shows a cross section of a transistor according to another embodiment of the invention.

The methods described herein may also be used in situations in which it is desirable to induce strain in regions of single crystalline Si. For example, the invention could be used to create strained channel regions in a transistor. The strained channel regions may be single crystal strained Si, which can be achieved by a process similar to that described above. All depositions described herein can be made selective by employing etchants simultaneously with CVD precursors, as will be understood by the skilled artisan. Referring to FIG. 4, oxygen 410 can be formed on the surface of a Si substrate 400. A fully relaxed and thin region of SiGe 420 can be formed over the Si substrate 400. In some embodiments, the SiGe 420 is selectively deposited such that it forms only in the active area previously defined by shallow trench isolation (STI). The single crystal strained Si region 430 can be formed over the fully relaxed SiGe 420. In some embodiments, the strained Si region 430 is selectively deposited such that it forms only in the active area previously defined by shallow trench isolation (STI). Some embodiments include additional steps to make a device, such as a transistor 450, that comprises the strained Si region 430. For example, a gate electrode 440 may be located above the Si region 430.

Figure 5:
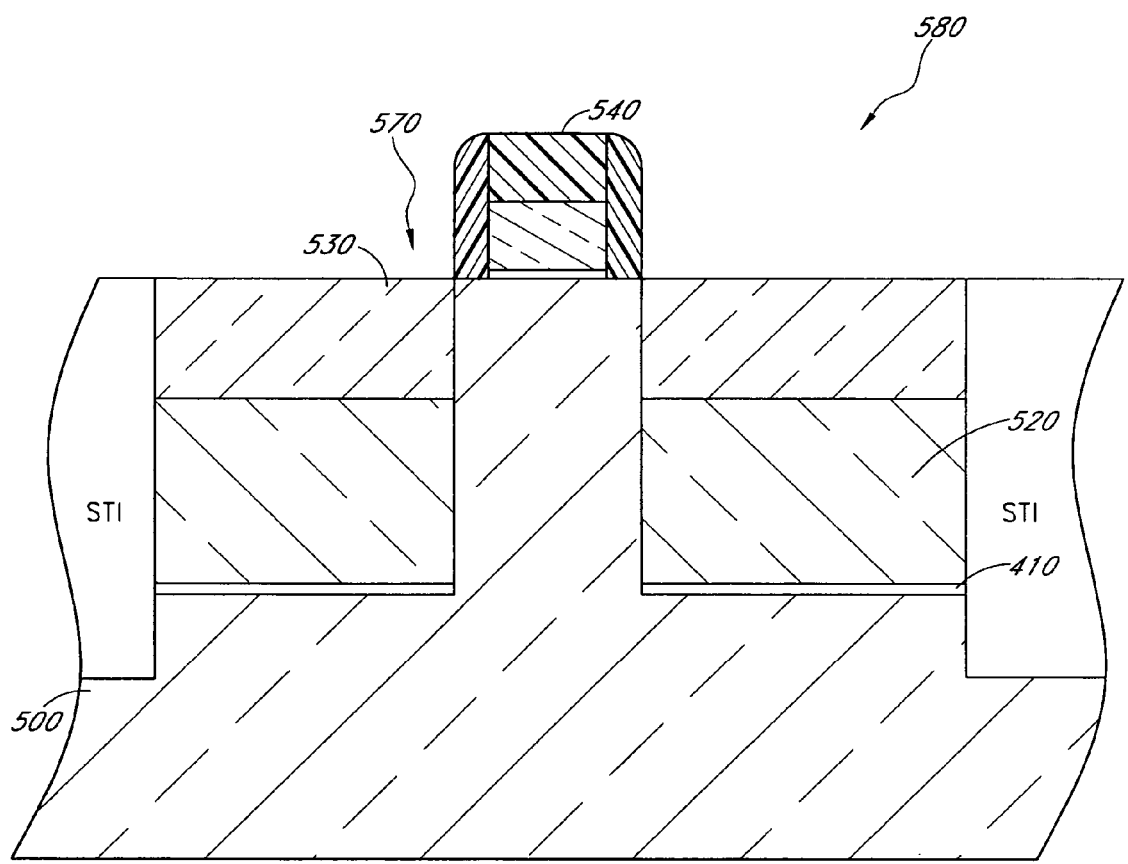
FIG. 5 shows a cross section of a transistor according to an alternative embodiment of the invention.

In some embodiments, the invention allows strain in single crystalline Si in recessed areas that form source regions 470 and drain regions 480. See FIG. 5. Strained single crystalline Si in the source and drain regions can be achieved by a process similar to that described above. The depositions can be made selective by employing etchants simultaneously with CVD precursors, as will be understood by the skilled artisan. Referring to FIG. 5, oxygen 510 can be formed on the surface of a Si substrate 500. A fully relaxed and thin region of SiGe 520 can be formed over the Si substrate 500. In some embodiments, the SiGe 520 is selectively deposited such that it forms only in the source and drain regions 570, 580. The single crystal strained Si region 530 can be formed over the fully relaxed SiGe 520. In some embodiments, the strained Si region 530 is selectively deposited such that it forms only in the source and drain regions 570, 580. Preferably, the processes described above provide a more efficient process to create strained regions that result in increased carrier mobility.

In summary, methods described herein can be employed to produce fully relaxed SiGe layers 120 that are of less thickness than a SiGe layer deposited without an oxidation at the SiGe/Si interface under substantially identical conditions. The preferred process flow to achieve this result is set forth in bullet point below. It will be understood that variations to or omissions from the list below can be made while still obtaining benefits of the process.

- Start with a single crystal Si structure.
- Clean native oxide.
- Cooling while optionally bleeding surface active compound (e.g., DCS) to the substrate.
- Controlled, slight oxidation of Si substrate
- Heteroepitaxial deposition of a fully relaxed SiGe layer
- Deposition of an overlying semiconductor layer (e.g., could serve as strained epi-Si channel)

Although the foregoing invention has been described in terms of certain preferred embodiments, other embodiments will become apparent to those of ordinary skill in the art in view of the disclosure herein. Accordingly, the present invention is not intended to be limited by the recitation of preferred embodiments, but is intended to be defined solely by reference to the appended claims.

We claim:

1. A method of forming an integrated circuit comprising:
providing a top surface of a single crystal semiconductor structure with a non-zero concentration of oxygen of less than about $7 \times 10^{14}$ atoms/cm$^2$; and
epitaxially depositing a fully relaxed second single crystal structure onto the top surface having the concentration of oxygen.

2. The method of claim 1 wherein the top surface is cleaned prior to providing oxygen to the top surface.

3. The method of claim 1 wherein the concentration of oxygen at the top surface is in the range of $10^{13}$ to $10^{14}$ atoms/cm$^2$.

4. A method of forming an integrated circuit comprising:
oxidizing the Si on a top surface of a first single crystal semiconductor structure wherein oxidizing provides the top surface of the first single crystal structure with a concentration of oxygen less than about $7 \times 10^{14}$ atoms/cm$^2$;
heteroepitaxially depositing a second single crystal structure directly over the oxidized surface, the second single crystal structure having a different material composition from the first single crystal structure wherein the second single crystal structure is fully relaxed as deposited.

5. The method of claim 4 wherein the first single crystal semiconductor structure is the top surface of a wafer.

6. The method of claim 4 wherein the second single crystal structure is free of cross hatches as deposited.

7. The method of claim 4 wherein the thickness of the second single crystal structure is less than 2000 Å.

8. The method of claim 4 wherein the top surface of the first single crystal structure is oxidized such that a concentration of oxygen on the top surface is in the range of $10^{13}$ to $10^{14}$ atoms/cm$^2$.

9. A method of fabricating an integrated circuit comprising:
cleaning a Si substrate;
forming at least a partial layer of oxidation on a cleaned surface of the Si substrate from the Si on the substrate surface wherein forming at least a partial layer of oxidation comprises forming a concentration of oxygen less than about $7 \times 10^{14}$ atoms/cm$^2$ on the cleaned surface of the Si substrate; and
depositing onto the oxidized surface of the Si substrate a heteroepitaxial layer of a different material composition from the Si substrate.

10. The method of claim 9 wherein the concentration of oxygen on the cleaned surface of the Si substrate is $10^{13}$ to $10^{14}$ atoms/cm$^2$.

11. The method of claim 9, wherein the heteroepitaxial layer is fully relaxed as deposited.

12. A method of fabricating an integrated circuit comprising:
conducting a native oxide clean of a Si substrate;
oxidizing a top surface of the Si substrate to form an oxidized surface from the Si on the substrate surface wherein the surface is oxidized such that the concentration of oxygen on the top surface of the Si substrate is less than about $7 \times 10^{14}$ atoms/cm$^2$; and
depositing onto the oxidized surface formed from the Si substrate a heteroepitaxial layer of SiGe, wherein the SiGe is fully relaxed as deposited.

13. The method of claim 12 wherein the thickness of the SiGe layer is less than 2000 Å.

14. The method of claim 13 wherein the SiGe layer is free of cross hatches as deposited.

15. The method of claim 12 wherein the surface is oxidized such that the concentration of oxygen on the top surface of the Si substrate is in the range of $10^{13}$ to $10^{14}$ atoms/cm$^2$.

16. The method of claim 12, wherein oxidizing the top surface of the Si substrate forms less than about one monolayer of SiO$_2$.

* * * * *